US012696510B2

(12) United States Patent
Xie et al.

(10) Patent No.: US 12,696,510 B2
(45) Date of Patent: Jul. 28, 2026

(54) ENHANCEMENT-MODE GaN HFET INCLUDING ScAlN AND METHOD OF MANUFACTURING THE SAME

(71) Applicant: Qorvo US, Inc., Greensboro, NC (US)

(72) Inventors: Jinqiao Xie, Allen, TX (US); Edward A. Beam, III, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 559 days.

(21) Appl. No.: 18/007,063

(22) PCT Filed: Aug. 5, 2021

(86) PCT No.: PCT/US2021/044690
§ 371 (c)(1),
(2) Date: Jan. 27, 2023

(87) PCT Pub. No.: WO2022/031937
PCT Pub. Date: Feb. 10, 2022

(65) Prior Publication Data
US 2023/0290834 A1     Sep. 14, 2023

Related U.S. Application Data

(60) Provisional application No. 63/061,823, filed on Aug. 6, 2020.

(51) Int. Cl.
| | |
|---|---|
| *H10D 62/85* | (2025.01) |
| *H10D 30/01* | (2025.01) |
| *H10D 30/47* | (2025.01) |
| *H10D 62/824* | (2025.01) |

(52) U.S. Cl.
CPC ....... *H10D 62/8503* (2025.01); *H10D 30/015* (2025.01); *H10D 30/475* (2025.01); *H10D 62/824* (2025.01)

(58) Field of Classification Search
CPC ............. H10D 62/8503; H10D 62/824; H10D 62/149; H10D 64/411; H10D 30/015; H10D 30/475
See application file for complete search history.

(56) References Cited

U.S. PATENT DOCUMENTS

| | | | |
|---|---|---|---|
| 7,728,356 B2 | 6/2010 | Suh et al. | |
| 10,651,048 B1 * | 5/2020 | Henry | ............... H01L 21/68778 |
| 2018/0158909 A1 * | 6/2018 | Mishra | ............... H10D 30/4738 |

OTHER PUBLICATIONS

A. J. Green et al., ("ScAlN/GaN High-Electron-Mobility Transistors With 2.4-A/mm Current Density and 0.67-S/mm Transconductance," IEEE Electron Device Letters, vol. 40, No. 7) (Year: 2019).*

(Continued)

*Primary Examiner* — William B Partridge
*Assistant Examiner* — Chevy J Boegel
(74) *Attorney, Agent, or Firm* — Withrow & Terranova, P.L.L.C.

(57)     ABSTRACT

A semiconductor device is disclosed. The semiconductor device has a substrate with a gallium nitride layer (14) disposed over the substrate. A scandium aluminum nitride layer (10) is disposed over the gallium nitride layer. A source (18) is in contact with the gallium nitride layer, and a drain (20) is spaced from the source, wherein the drain is in contact with the gallium nitride layer.

20 Claims, 14 Drawing Sheets

(56)  References Cited

OTHER PUBLICATIONS

ScAIN/GaN High-Electron-Mobility Transistors With 2.4-A/mm Current Density and 0.67-S/mm Transconductance (Year: 2019).*

Burnham, S. D., et al. "Gate-recessed normally-off GaN-on-Si HEMT using a new 02-BCl3 digital etching technique," Physica Status Solidi C, vol. 7, Issue 7-8, Special Issue: 8th International Conference on Nitride Semiconductors (ICNS-8), Jul. 2010, pp. 2010-2012.

Green, A.J. et al., "ScAIN/GaN High-Electron-Mobility Transistors With 2.4-A/mm Current Density and 0.67-S/mm Transconductance," IEEE Electron Device Letters, vol. 40, No. 7, Jul. 2019, IEEE, pp. 1056-1059.

Hardy, M. et al., "Epitaxial ScAIN Etch-Stop Layers Grown by Molecular Beam Epitaxy for Selective Etching of AlN and GaN," IEEE Transactions on Semiconductor Manufacturing, vol. 30, No. 4, Nov. 2017, 5 pages.

Moon, J. S., et al. "Gate-recessed AIGaN-GaN HEMTs for high-performance millimeter-wave applications," IEEE Electron Device Letters, vol. 26, Issue 6, Jun. 2005, first published May 2005, IEEE, pp. 348-350.

Sato, T., et al. "Damage-less Wet Etching for Normally-off AIGaN/ GaN HEMTs Using Photo-electrochemical Reactions," International Conference on Compound Semiconductor Manufacturing Technology, Apr. 2019, Retrieved from the Internet: [https://csmantech. org/wp-content/acfrcwduploads/field_5e8cddf5ddd10/post_1314/ 010.2_S10_P2_SATO.pdf], 6 pages.

Vanko, G., et al. "Impact of SF6 plasma treatment on performance of AlGaN/GaN HEMT," Vacuum, vol. 84, Aug. 2009, Elsevier, pp. 235-237.

International Search Report and Written Opinion for International Patent Application No. PCT/US2021/044690, mailed Oct. 21, 2021, 16 pages.

* cited by examiner

Recessed ←    → No Recess

| | |
|---|---|
| A | B |
| Recessed SD gate | No recess SD gate |
| Recessed + AlOx at gate | No recess +AlOx at gate |
| C | D |

SD gate

ALD AlOx, 50 Å

ENHANCEMENT-MODE GaN HFET INCLUDING ScAlN AND METHOD OF MANUFACTURING THE SAME

RELATED APPLICATIONS

This application is a 35 U.S.C. § 371 national phase filing of International Application No. PCT/US2021/044690, filed Aug. 5, 2021, which claims the benefit of provisional patent application Ser. No. 63/061,823, filed Aug. 6, 2020, the disclosures of which are hereby incorporated herein by reference in their entireties.

FIELD OF THE DISCLOSURE

The present disclosure relates to an enhancement-mode gallium nitride heterostructure field-effect transistor.

BACKGROUND

Gallium nitride (GaN) technology is continuously penetrating the commercial communication market and power switch market. For some applications, enhancement-mode transistors or enhancement-mode/depletion-mode integrated circuits are desirable. However, currently, many GaN heterojunction field-effect transistors (HFETs) are based on depletion-mode transistors.

Depletion-mode and enhancement-mode gallium arsenide (GaAs) pseudomorphic high electron mobility transistors are routinely manufactured using a wet etch process with an excellent etch stop layer. The lack of enhancement-mode GaN transistors is primarily due to the absence of an efficient etch stop layer, either for a dry etch process or for a wet etch process. Numerous methods have been proposed to make enhancement-mode transistors using processes such as timed dry etch, sulfur hexafluoride ($SF_6$)—based plasma treatment, photo-assisted wet etching, employing p-type GaN at the gate, and atomic layer etching. Without an etch stop layer, timed etching is not suitable for manufacture because it results in poor reproducibility and uniformity. The method using $SF_6$ plasma treatment is unstable, and devices fabricated using $SF_6$ plasma treatment degrade relatively very quickly during operation. Photo-assisted wet etching gate leakage is increased due to the preferential etching at defects that are typically hole or electron traps. Moreover, an etch stop layer is not presented with photo-assisted wet etching, which makes photo-assisted wet etching undesirable for manufacturing. The method using a p-type GaN gate requires a relatively more complicated epitaxial stack and fabrication processes. Moreover, devices with a p-type gate have low doping efficiency (high resistivity) and migration of the p-type dopant (magnesium) during device operation, which are not desirable for high-performance, high-frequency, and high-power applications. Thus, there is a need for a simple etch stop layer for the manufacture of GaN-based enhancement-mode transistors.

SUMMARY

A semiconductor device is disclosed. The semiconductor device has a substrate with a gallium nitride layer disposed over the substrate. A scandium aluminum nitride layer is disposed over the gallium nitride layer. A source is in contact with the gallium nitride layer, and a drain is spaced from the source, wherein the drain is in contact with the gallium nitride layer.

In exemplary embodiments the semiconductor device has an aluminum gallium nitride layer disposed between the gallium nitride layer and the scandium aluminum nitride layer. A gate that extends through the scandium aluminum nitride layer and is in contact with a surface of the aluminum gallium nitride layer to realize a field-effect transistor having an enhancement mode of operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figures 4A, 4B, 4C:
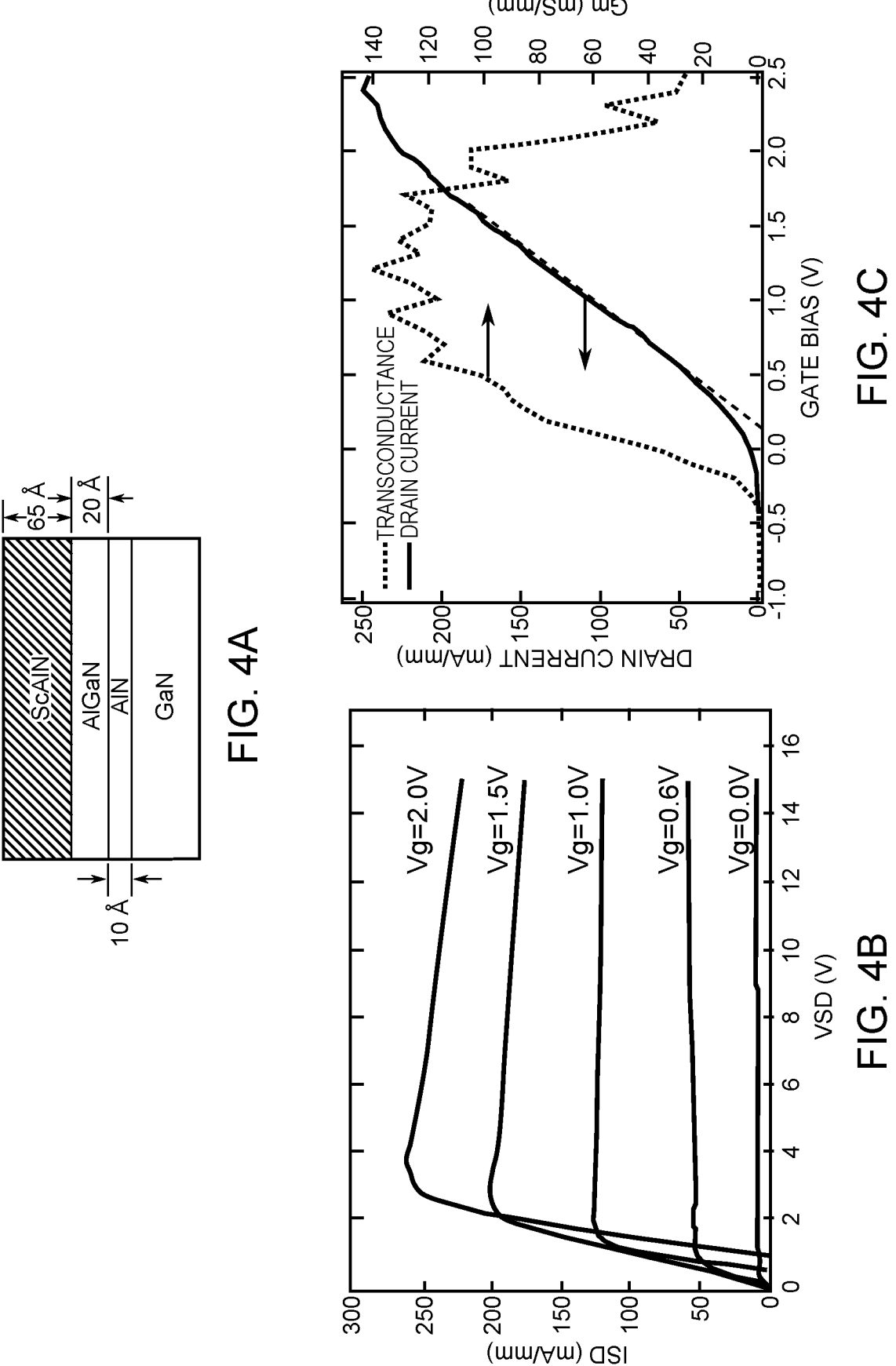

FIGS. 4A, 4B, and 4C are diagrams showing current-voltage characteristics for a fully fabricated ScAlN/GaN FET, with a recessed gate, showing a pinch-off voltage of approximately +0.1 V.

Figure 5:
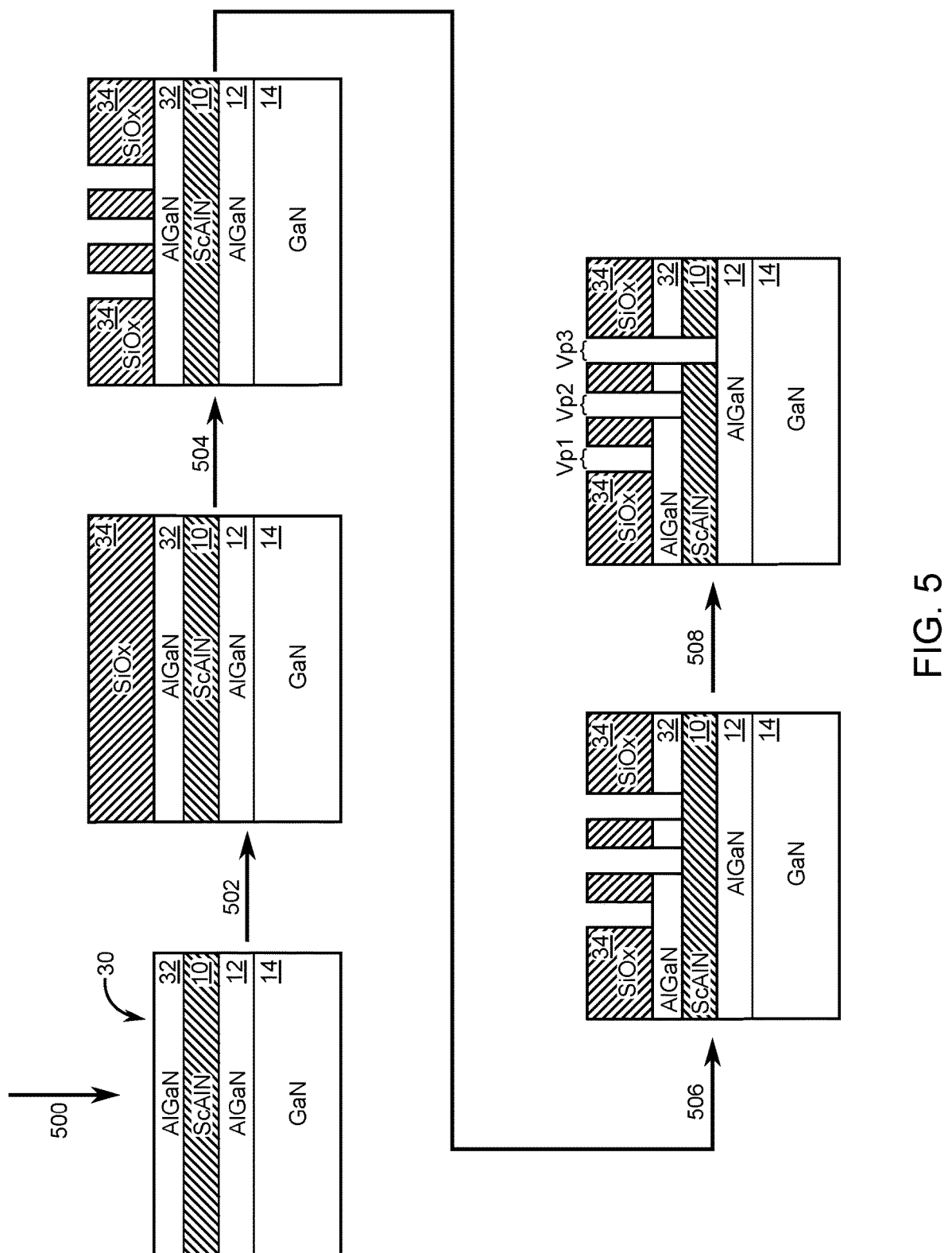

FIG. 5 is a diagram showing the process flow for ScAlN wet etch for monolithic integration of depletion mode (different Vp's) and enhancement mode on the same wafer.

Figures 6A, 6B:
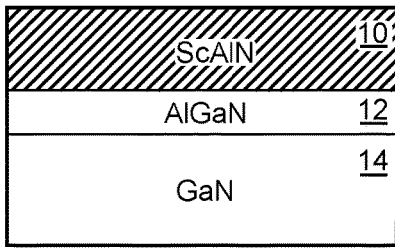

FIG. 6A shows a starting epitaxial stack of a test wafer.

FIG. 6B shows a test wafer, each quarter of which has a different gate process.

Figure 7:
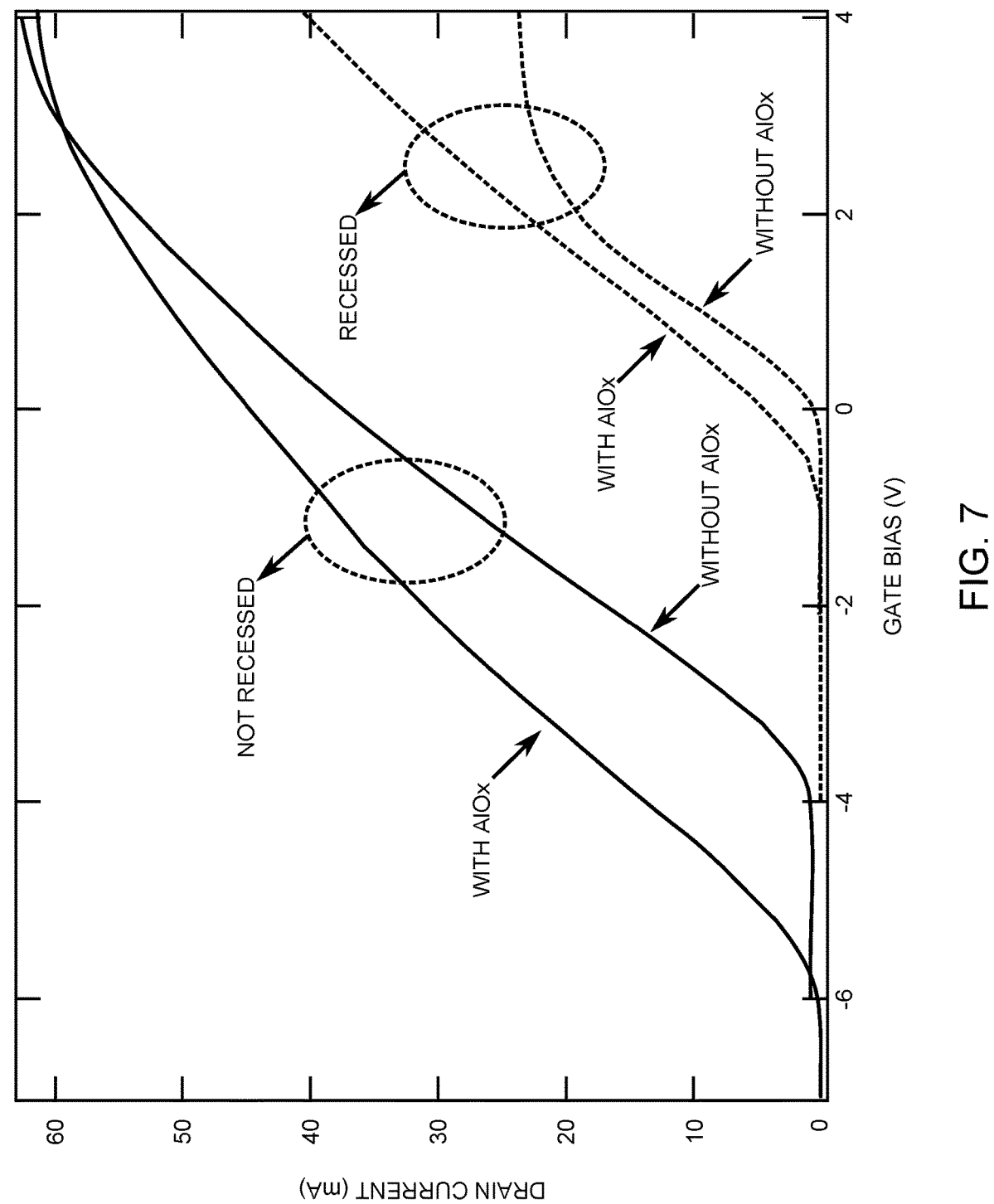

FIG. 7 is a graph showing (a) a gate dielectric without the ScAlN recess (depletion mode) and (b) a gate dielectric with a ScAlN recess (enhancement mode).

Figure 8:
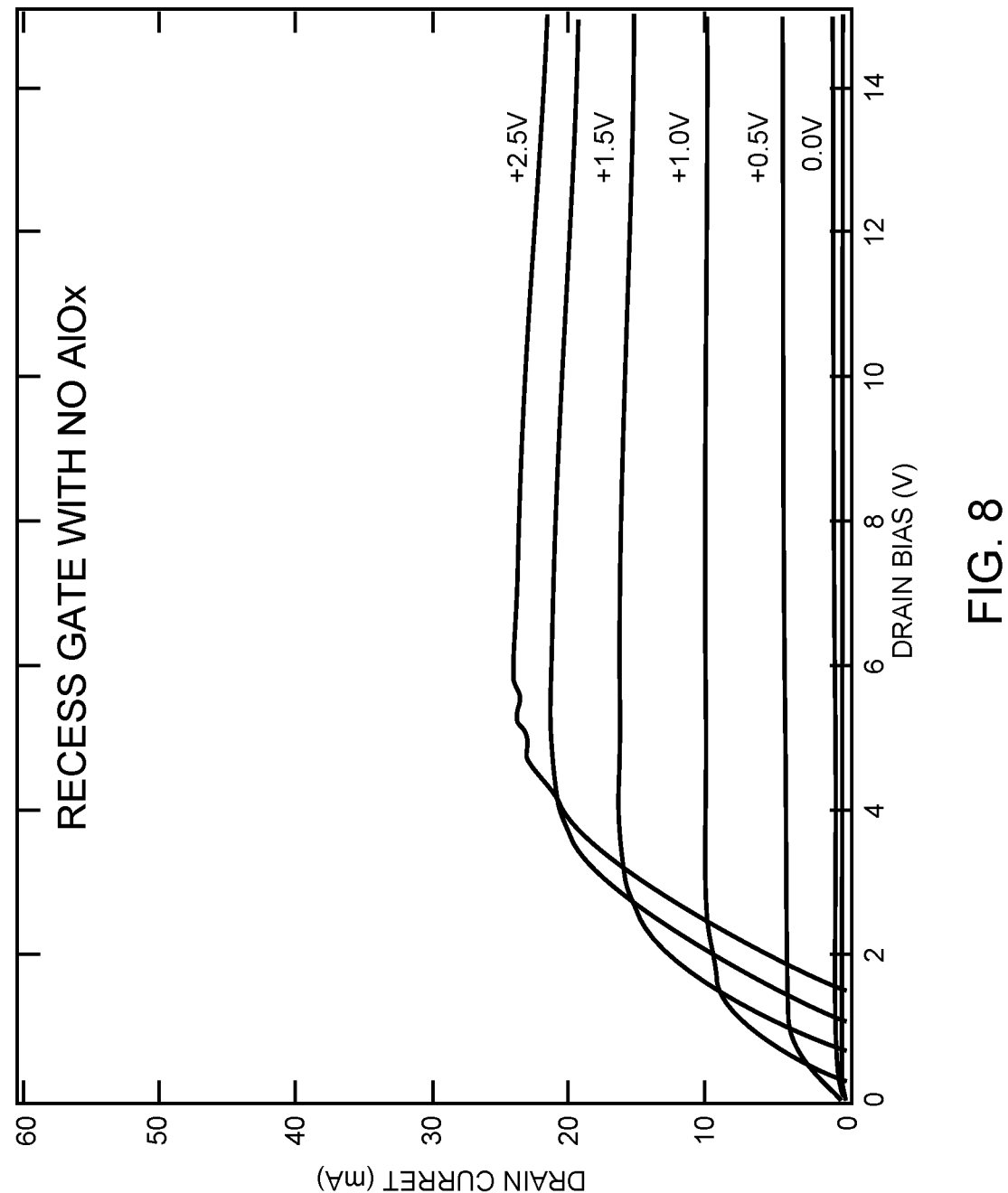

FIG. 8 is a graph showing drain current and drain bias for a transistor from the test wafer (FIG. 6B), wherein the transistor has a recess gate and no aluminum oxide ($AlO_x$).

Figure 9:
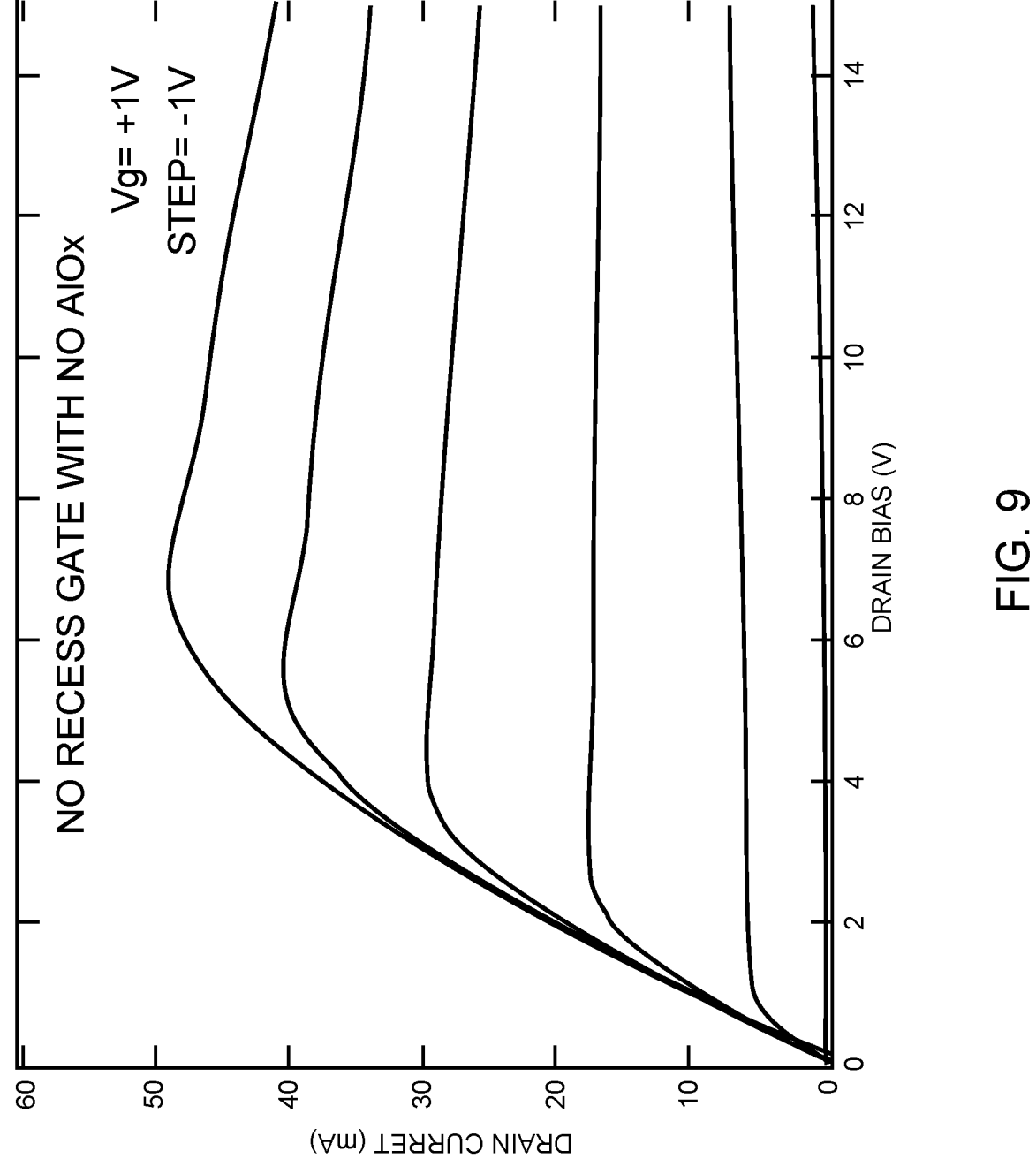

FIG. 9 is a graph showing drain current and drain bias for a transistor from the test wafer, wherein the transistor has no recess gate and no $AlO_x$.

Figure 10:
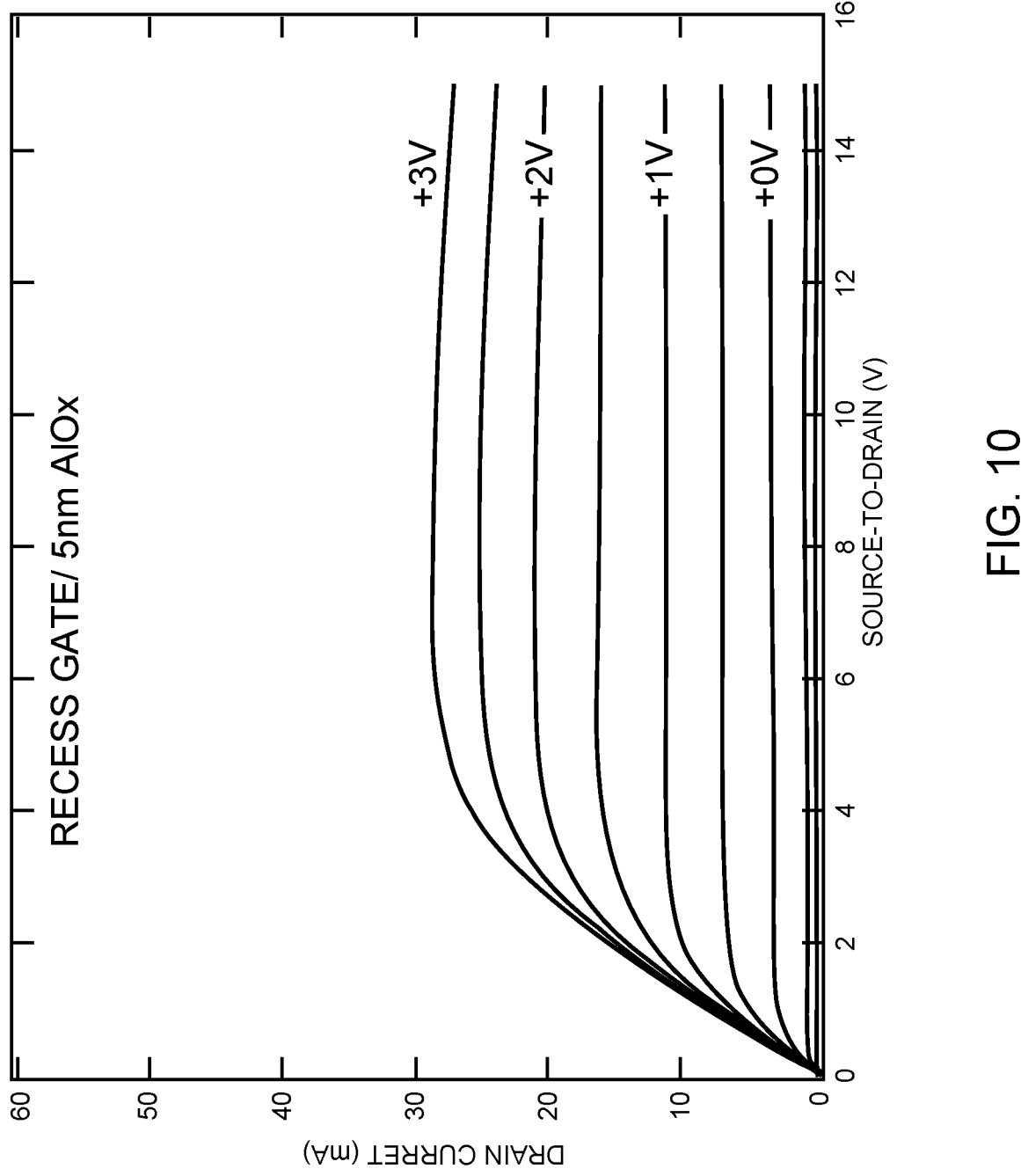

FIG. 10 is a graph showing drain current and source-to-drain bias for a transistor from the test wafer, wherein the transistor has with a recess gate of 5 nm $AlO_x$.

Figure 11:
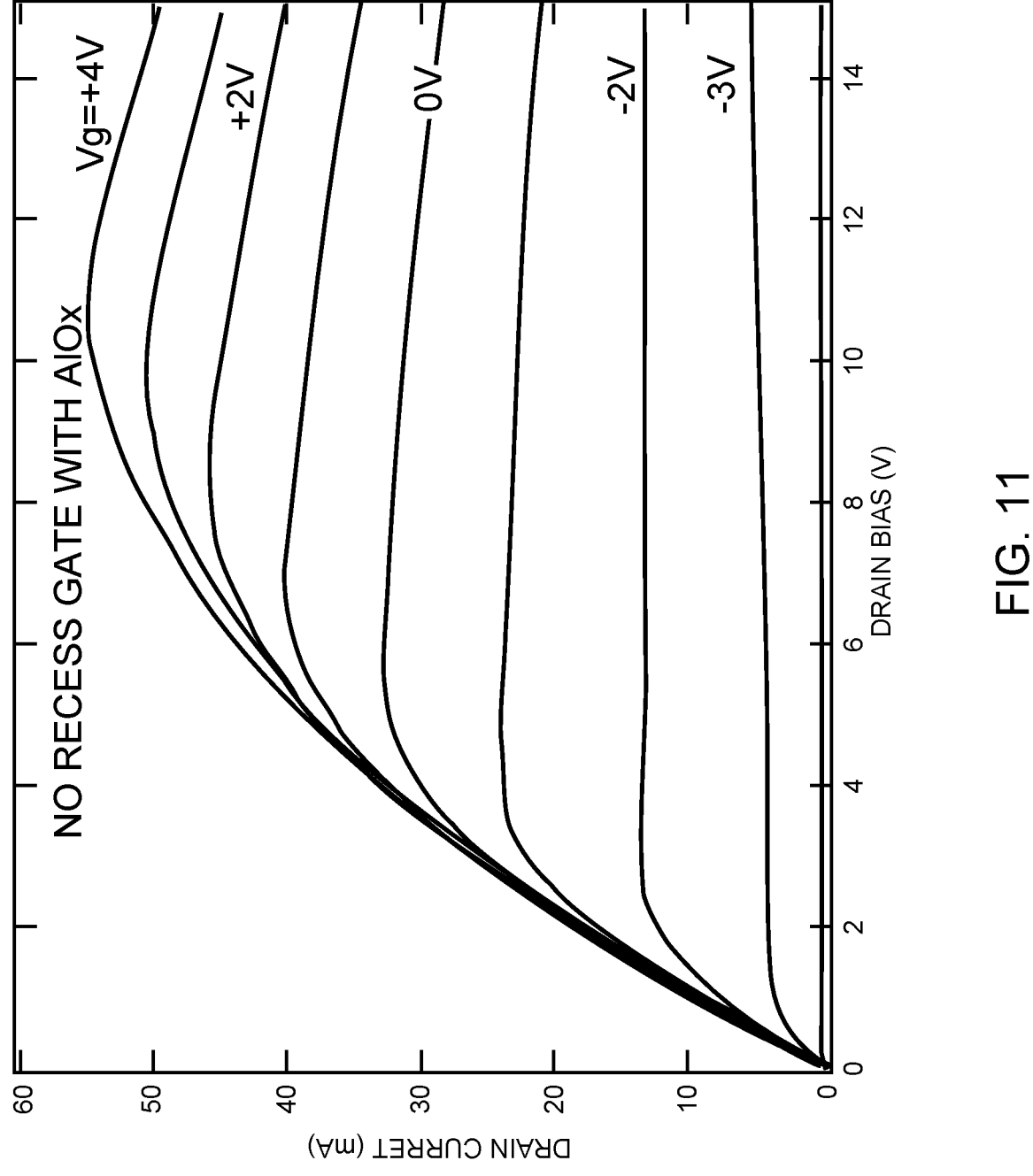

FIG. 11 is a graph showing drain current and drain bias for a transistor from the test wafer, wherein the transistor has no recess gate and with $AlO_x$.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Gallium nitride (GaN)—based heterojunction field-effect transistors (HFETs) have been emerging as the next generation of communication technology. Conventional III-V—based HFETs have mature processes that integrate both enhancement-mode and depletion-mode transistors. The enhancement-mode HFETs are realized by gate recess technology. However, GaN-based HFETs do not have such a reliable recess technology, primarily due to the lack of an etch stop layer. The present disclosure relates to a recess process with an excellent etch stop for GaN-based HFETs. Moreover, this process is based on wet chemical etching, which may result in a damage-free surface that is not typically seen with dry etch-based processes.

Research on scandium aluminum nitride (ScAlN)—based GaN HFETs, has shown that ScAlN can be efficiently etched by a piranha solution, a mixture of sulfuric acid ($H_2SO_4$) and hydrogen peroxide ($H_2O_2$). In contrast, GaN or aluminum gallium nitride (AlGaN) are not etched by the piranha mixture at all. Table 1 summarizes the etch rate difference between GaN, AlGaN, and ScAlN.

TABLE 1

| Etch rate comparison for GaN, AlGaN, and ScAlN | | | |
| --- | --- | --- | --- |
| Etchant | GaN | $Al_{0.22}Ga_{0.78}N$ | $Sc_{0.18}Al_{0.82}N$ |
| $H_2SO_4{:}H_2O_2$ (3:1) | Not measurable | Not measurable | ~10-20 A/min |
| $H_2SO_4{:}H_2O_2$ (3:2) | Not measurable | Not measurable | ~10-50 A/min |
| Aqua Regia (not heated) | Not measurable | Not measurable | Not measurable |

Figure 1C:
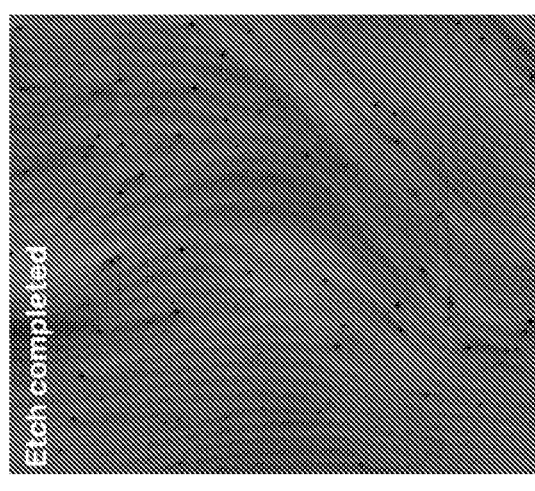
FIG. 1C is a micrograph (AFM image) of a completed etch of the ScAlN layer of FIG. 1A.
Figure 1B:
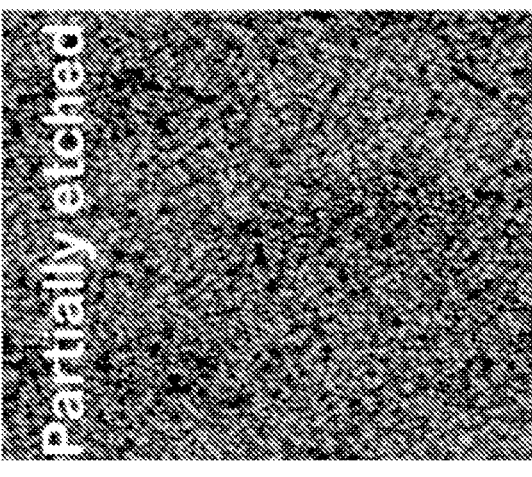
FIG. 1B is a micrograph (AFM image) of a partial etch of the ScAlN layer of FIG. 1A.
Figure 1A:
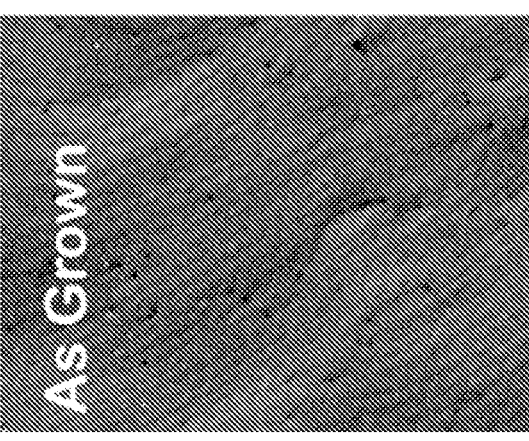
FIG. 1A is a micrograph (atomic force microscopy, AFM) of a surface of an as-grown scandium aluminum nitride (ScAlN) layer.
Figure 1D:
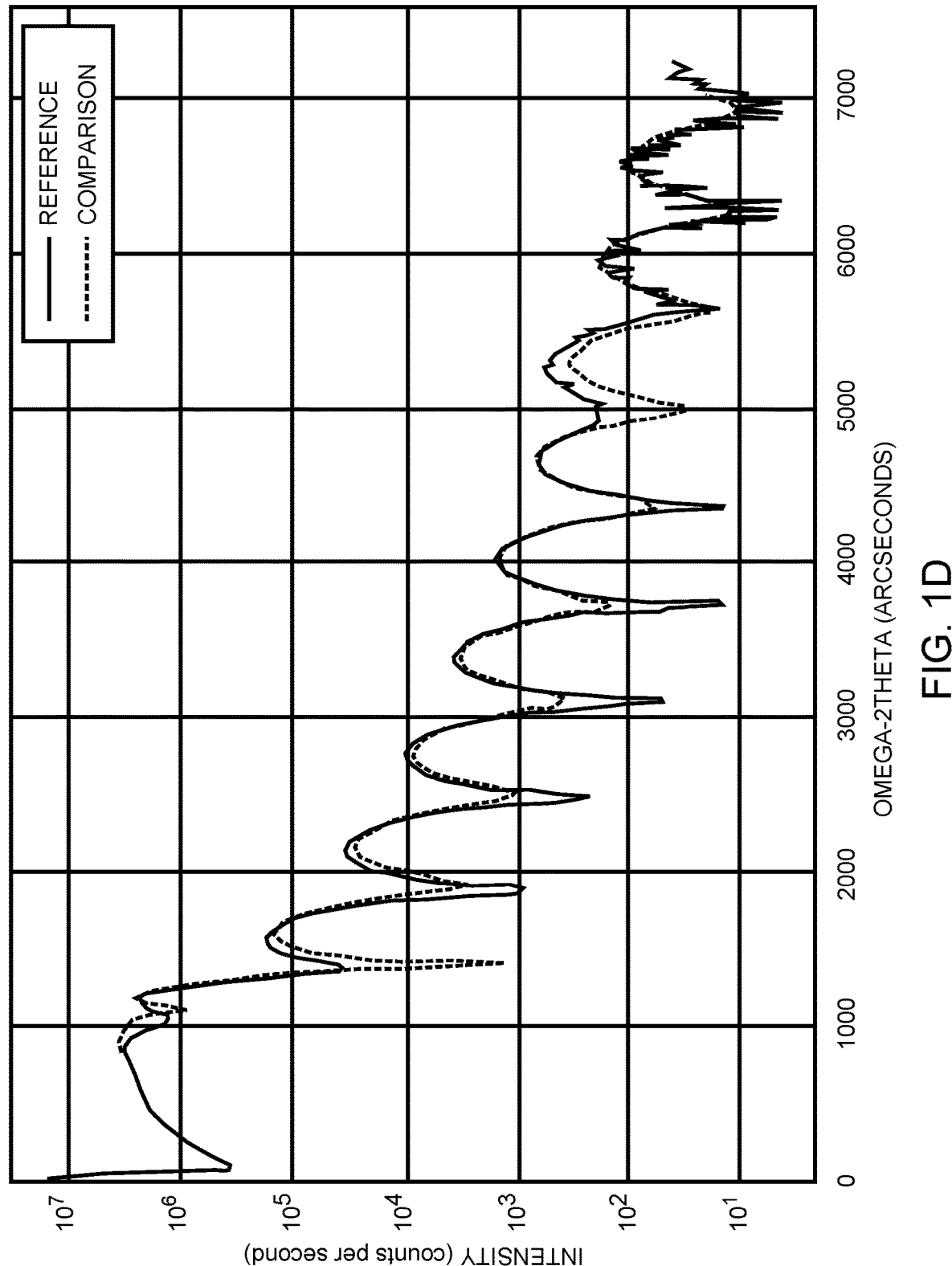
FIG. 1D is a graph showing X-ray reflectivity (XRR) spectrum showing thickness fringes associated with the surface of the as-grown ScAlN layer shown in FIG. 1A.
Figure 1E:
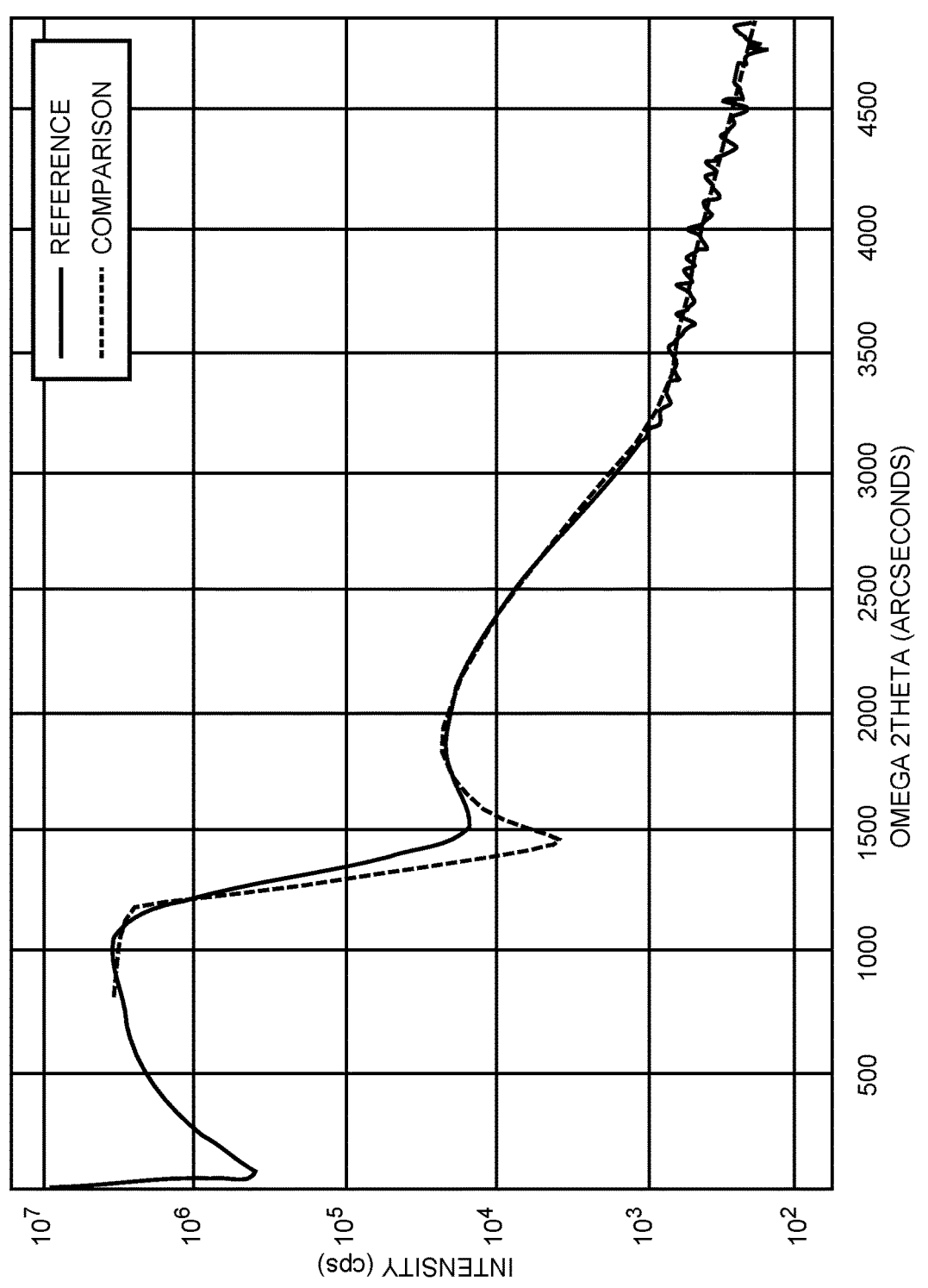
FIG. 1E is a graph showing an XRR spectrum that corresponds to the partially etched surface shown in FIG. 1B.

FIGS. 1A, 1B and 1C show an evolution of an etched surface for a ScAlN layer deposited on a GaN wafer in a $H_2SO_4{:}H_2O_2$ (3:1) solution. FIG. 1A is an AFM image of an as-grown surface showing a typical morphology with atomic steps visible. Atomic steps are absent in FIG. 1B, which is an AFM image of a partial etch of the ScAlN layer of FIG. 1A. FIG. 1C is an AFM image of a GaN template surface after completely etching away the ScAlN layer, atomic steps reappear and belong to the GaN template that was used for the ScAlN deposition. After the ScAlN layer is completely etched away, leaving the GaN wafer in piranha solution for a longer time does not change the surface morphology since the etch rate of GaN and AlGaN in piranha is negligible. X-ray reflectivity (XRR) was used to determine the thickness for etch rate calculation. FIG. 1D is a graph showing XRR spectrum showing thickness fringes associated with the thickness and surface of the as-grown ScAlN layer shown in FIG. 1A. FIG. 1E is a graph showing an XRR spectrum that corresponds to the partially etched surface shown in FIG. 1B.

Figure 2:
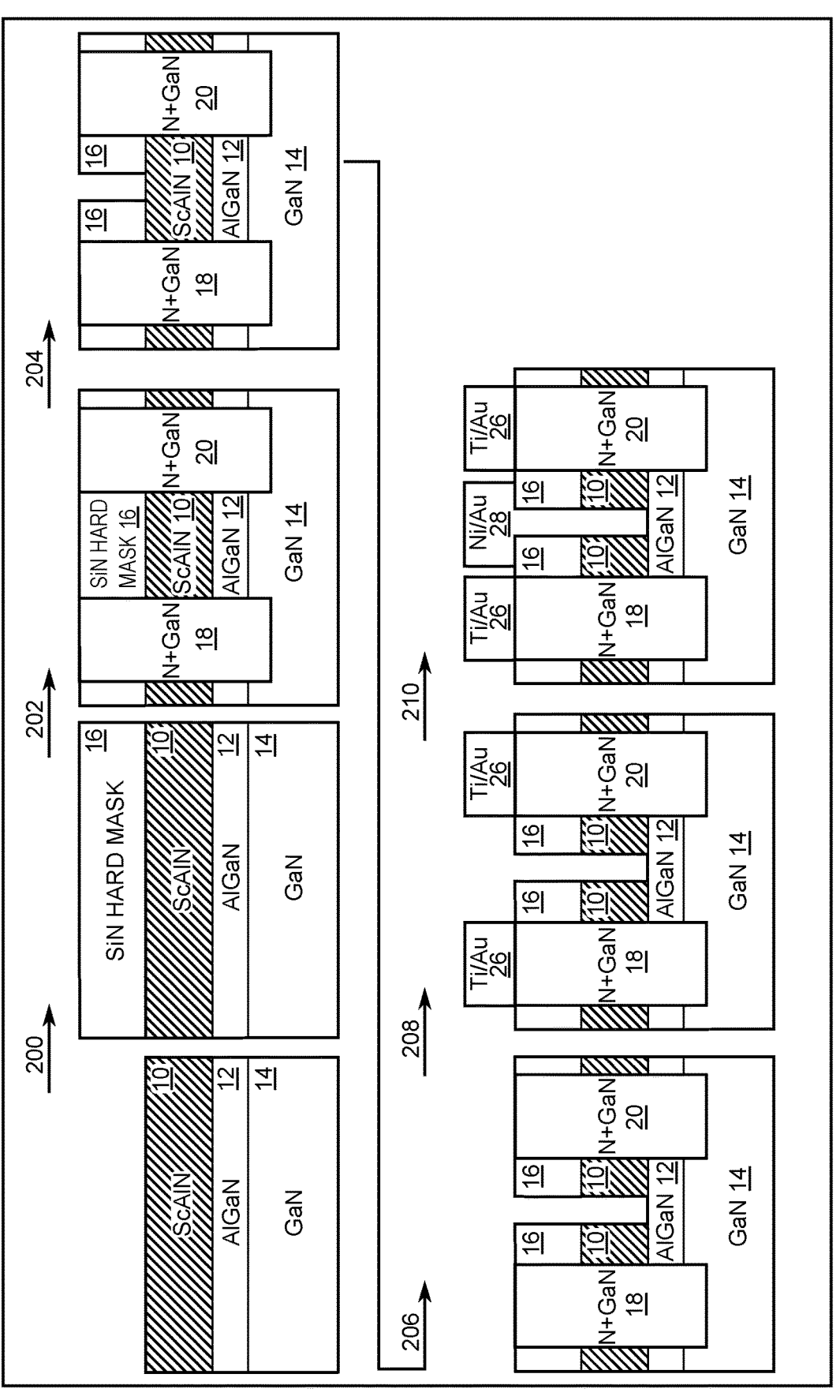
FIG. 2 is a diagram showing a possible simplified process flow for making enhancement-mode ScAlN/gallium nitride (GaN) heterojunction field-effect transistors.

FIG. 2 shows a simplified process flow that in accordance with the present disclosure is usable to fabricate enhancement-mode ScAlN/GaN HFETs. Starting with an epitaxial stack having a ScAlN layer 10, an AlGaN layer 12, and a GaN layer 14, a mesa is first defined, followed by a hard mask 16 (silicon nitride [$SiN_x$], or silicon oxide [$SiO_x$]) deposited by plasma-enhanced chemical vapor deposition (Step 200). Following a contact regrowth process (Step 202), n+ GaN is deposited for non-alloyed ohmic formation at a source 18 and a drain 20. The hard mask 16 can be used as a passivation layer (trunk nitride) or can be removed and re-deposited with a standard trunk nitride. After the trunk is opened (Step 204), the ScAlN layer 10 is exposed for recess etching. In some cases, the SiNx or SiOx hard masks for regrowth can also serve as the hard mask 16 for the recess etch mask. Selective etching of the ScAlN layer 10 (step 206) exposes an AlGaN layer 12 surface. After completing the selective etch, ohmic contacts 26 (Step 208) and gate metal 28 (Step 210) are deposited. In some embodiments, the mesa may have epitaxial layers such as $Sc_{0.18}Al_{0.82}N/Al_{0.22}Ga_{0.78}N/AlN/GaN/SiC$ layers. In some embodiments, the scandium aluminum nitride layer is made of $Sc_xAl_{(1-x)}N$ with x being between 0.1 and 0.3. In some embodiments, the aluminum gallium nitride layer is made of $Al_xGa_{(1-x)}N$ with x being between 0.05 and 0.4.

Figure 3A:
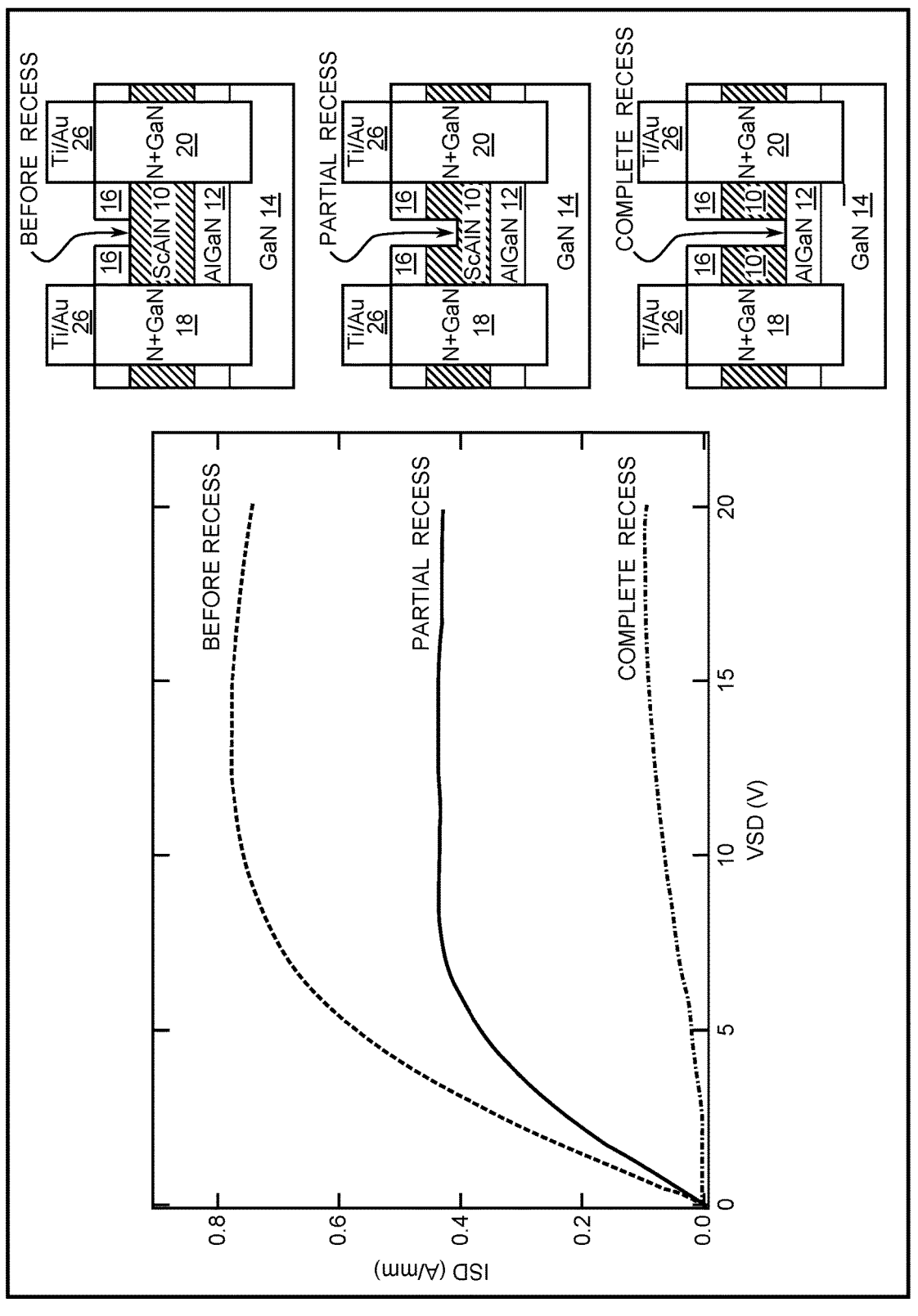
FIG. 3A is a diagram showing an open channel I-V change of the source-drain current for the same channel during the gate recess.
Figure 3B:
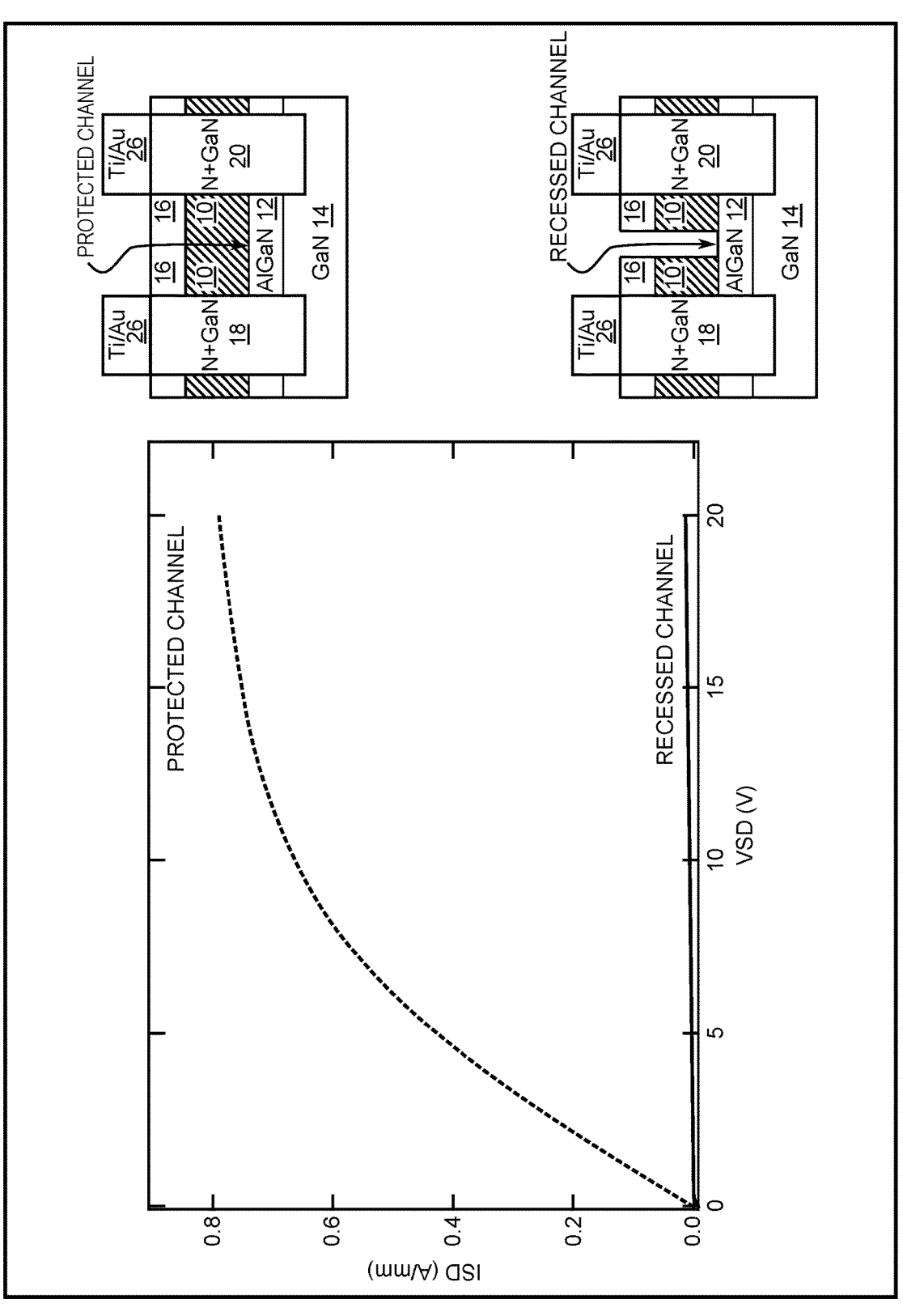
FIG. 3B is a diagram showing a comparison of the source-drain current for a protected channel (not recessed) and a fully recessed channel.

FIGS. 3A and 3B show two examples of an effect of recess on the source-drain current (ISD) versus source-to-drain voltage (VSD). The ISD is measured without the gate metal 28 (FIG. 2), as indicated in the schematics on the right side of the graph. FIG. 3A corresponds to a first example of the two examples, and shows for the same channel, that ISD decreases monotonously as the gate recess progresses. FIG. 3B corresponds to a second example of the two examples and compares ISD for two channels: fully recessed vs. protected (not recessed).

Finally, a transistor was fabricated with a recessed gate, and a barrier layer (FIG. 4A) that includes an AlN spacer of 10 Å, an AlGaN spacer of 20 Å, and a ScAlN barrier of 65 Å. In some embodiments, the ScAlN is 65 Å thick±25 Å. In yet other embodiments, the ScAlN layer is between 20 Å and 500 Å thick. FIG. 4B depicts drain current versus source-to-drain voltage for various gate voltages. FIG. 4C depicts drain current (solid line) and transconductance gm (dotted line) versus gate bias voltage. The transistor shows an enhancement-mode operation, with a pinch-off voltage of around +0.1 V as indicated by a straight dashed line intersecting the gate bias voltage axis. The pinch-off voltage for the same epitaxial structure is approximately −5 V (not shown) when a related-art GaN fabrication process was used. The gate leakage increases after Schottky gate is turned on for large forward bias. To achieve extremely low gate leakage, in some cases a gate dielectric may be needed.

The method of the present disclosure takes advantage of an etch stop for a recess gate process. Most fabricators rely on etch stop layers to achieve highly reliable processes for large-scale manufacture. The GaN and AlGaN are true etch stop layers for the gate recess process for ScAlN-based HFETs.

FIG. 5 is a diagram showing the process flow for ScAlN wet etch for monolithic integration of depletion mode (different Vp's) and enhancement mode on the same wafer. First, a wafer 30 with starting epitaxial layers is provided (Step 500). In this exemplary embodiment, a top AlGaN layer 32 has been grown over the ScAlN layer 10. Next, a hard mask 34 is formed over the top AlGaN layer 32 (Step 502). In this exemplary embodiment, the hard mask 34 is made of a silicon oxide (SiOx). Next, a dry etch is performed, stopping at the top AlGaN layer 32 (Step 504). Note, that a gate fabricated without further recess in the hard mask permits depletion mode with Vp1. Next, the dry etch is continued, stopping at the ScAlN layer 10 (Step 506). A gate fabricated without further recess in the ScAlN layer 10 permits depletion mode with Vp2. Next, a wet etch is performed to etch through the ScAlN layer 10 to the bottom AlGaN layer 12 (Step 508). An advantage of the wet etch is that the wet etch does not have to be timed to stop precisely to expose a top surface of the bottom AlGaN layer 12. Instead, an etchant used to wet etch through the ScAlN layer does not etch or penetrate the bottom AlGaN layer 12. The ScAlN layer 10 serves as a wet etchable buffer between the top AlGaN layer 32 and the bottom AlGaN layer 12. A gate fabricated at this point without further recess permits enhancement mode with Vp3.

FIG. 6A shows a starting epitaxial stack of a test wafer 36. FIG. 6B shows the test wafer 36 with each quarter having a different gate test process. Half of the test wafer 36 has a received recess; the other half of the test wafer 36 has a received atomic layer deposition $AlO_x$ under the gate. The test wafer 36 has a substrate 38 on which the epitaxial stack is disposed. The substrate 38 can be semiconductor substrates such as gallium nitride, sapphire, silicon, and silicon carbide.

FIG. 7 is a graph showing drain current versus gate bias voltage for a gate dielectric without the ScAlN recess (depletion mode) and a gate dielectric with a ScAlN recess (enhancement mode). The dielectric is to lower the gate leakage. Depletion mode and enhancement mode integration on a single integrated circuit can be realized.

FIG. 8 is a graph showing drain current and drain bias for a transistor from the test wafer 36 (FIG. 6B), wherein the transistor has a recess gate and no $AlO_x$. In this case, this transistor is operating in enhancement mode.

FIG. 9 is a graph showing drain current and drain bias for a transistor from the test wafer 36, wherein the transistor has no recess gate and no $AlO_x$. In this case, this transistor is operating in depletion mode.

FIG. 10 is a graph showing drain current and source-to-drain bias for a transistor from the test wafer 36, wherein the transistor has a recess gate and a 5 nm $AlO_x$ gate dielectric. In this case, this transistor is operating in enhancement mode.

FIG. 11 is a graph showing drain current and drain bias for a transistor from the test wafer 36, wherein the transistor has no recess gate and with $AlO_x$. In this case, this transistor is operating in depletion mode.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a substrate;
   a gallium nitride layer disposed over the substrate;
   an aluminum gallium nitride layer disposed over the gallium nitride layer, wherein the aluminum gallium nitride layer provides a wet etch stop once a surface of the aluminum gallium nitride layer is exposed to extend a gate recess through a scandium aluminum nitride layer disposed over the aluminum gallium nitride layer;
   a source in contact with the gallium nitride layer;
   a drain spaced from the source, wherein the drain is in contact with the gallium nitride layer; and
   a gate that extends through the scandium aluminum nitride layer and is in contact with a surface of the aluminum gallium nitride layer to configure the semiconductor device for enhancement mode operation.

2. The semiconductor device of claim 1 wherein the semiconductor device is a field-effect transistor having the enhancement mode of operation.

3. The semiconductor device of claim 1 wherein the scandium aluminum nitride layer is between 20 Å and 500 Å thick.

4. The semiconductor device of claim 1 further comprising a hard mask disposed over the scandium aluminum nitride layer.

5. The semiconductor device of claim 4 wherein the hard mask is a silicon nitride layer.

6. The semiconductor device of claim 1 wherein the scandium aluminum nitride layer is made of $Sc_xAl_{(1-x)}N$ with x being between 0.1 and 0.3.

7. The semiconductor device of claim 1 wherein the aluminum gallium nitride layer is made of $Al_yGa_{(1-y)}N$ with y being between 0.05 and 0.4.

8. The semiconductor device of claim 4 wherein the hard mask is made of silicon oxide.

9. A method of fabricating a semiconductor device comprising:

providing a substrate with a gallium nitride layer disposed over the substrate, an aluminum gallium nitride layer disposed over the gallium nitride layer, and a scandium aluminum nitride layer disposed over the aluminum gallium nitride layer, disposing a hard mask over the scandium aluminum nitride layer;

forming a source in contact with the gallium nitride layer;

forming a drain spaced from the source, wherein the drain is in contact with the gallium nitride layer;

dry etching a gate recess through the hard mask; and wet etching through the scandium aluminum nitride layer until the wet etching inherently stops once a surface of the aluminum gallium nitride layer is exposed to extend the gate recess through the scandium aluminum nitride layer.

10. The method of claim 9 further comprising forming a gate that extends through the scandium aluminum nitride layer and is in contact with the surface of the aluminum gallium nitride layer.

11. The method of claim 10 wherein the gate is made of metal.

12. The method of claim 10 further comprising disposing metal contacts over the source and drain, respectively.

13. The method of claim 10 wherein the semiconductor device is a field-effect transistor having an enhancement mode of operation.

14. The method of claim 9 wherein the scandium aluminum nitride layer is made of $Sc_xAl_{(1-x)}N$ with x being between 0.1 and 0.3.

15. The method of claim 9 wherein the aluminum gallium nitride layer is made of $Al_yGa_{(1-y)}N$ with y being between 0.05 and 0.4.

16. The method of claim 9 wherein the hard mask is made of a nitride compound.

17. The method of claim 16 wherein the nitride compound is silicon nitride.

18. The method of claim 9 wherein the hard mask is made of an oxide compound.

19. The method of claim 18 wherein the oxide compound is silicon oxide.

20. The method of claim 9 wherein the wet etching is performed using a mixture of sulfuric acid and hydrogen peroxide.

\* \* \* \* \*